(12) United States Patent
Ho

(10) Patent No.: US 12,309,952 B1
(45) Date of Patent: May 20, 2025

(54) ELECTRONIC DEVICE HOLDER

(71) Applicant: OXTI Pte Ltd, Singapore (SG)

(72) Inventor: Chih-Feng Ho, Singapore (SG)

(73) Assignee: OXTI PTE LTD, Singapore (SG)

( * ) Notice: Subject to any disclaimer, the term of this patent is extended or adjusted under 35 U.S.C. 154(b) by 260 days.

(21) Appl. No.: 18/127,673

(22) Filed: Mar. 29, 2023

(51) Int. Cl.
| | | |
|---|---|---|
| *H05K 5/02* | (2006.01) | |
| *F16M 11/10* | (2006.01) | |
| *F16M 11/20* | (2006.01) | |
| *F16M 11/28* | (2006.01) | |
| *F16M 13/02* | (2006.01) | |

(52) U.S. Cl.
CPC ........... *H05K 5/0234* (2013.01); *F16M 11/10* (2013.01); *F16M 11/2021* (2013.01); *F16M 11/28* (2013.01); *F16M 13/022* (2013.01); *F16M 2200/027* (2013.01); *F16M 2200/044* (2013.01); *F16M 2200/048* (2013.01)

(58) Field of Classification Search
CPC .. H05K 5/0234; F16M 11/10; F16M 11/2021; F16M 11/28; F16M 13/022; F16M 2200/027; F16M 2200/044; F16M 2200/048
See application file for complete search history.

(56) References Cited

U.S. PATENT DOCUMENTS

| | | | | |
|---|---|---|---|---|
| 6,769,657 | B1 * | 8/2004 | Huang ................. | F16M 13/022 248/278.1 |
| 7,289,315 | B2 * | 10/2007 | Hillman ................ | F16M 11/10 361/679.55 |
| 7,395,995 | B2 * | 7/2008 | Chen ................... | F16M 11/2064 248/291.1 |
| 7,404,233 | B2 * | 7/2008 | Lu ......................... | F16M 13/02 16/302 |
| 7,726,616 | B2 * | 6/2010 | Zhang ................. | F16M 11/2021 248/920 |
| 8,011,632 | B2 * | 9/2011 | Wang ..................... | F16M 11/10 248/920 |
| 8,256,725 | B2 * | 9/2012 | Wang ..................... | F16M 11/38 248/920 |
| 8,328,151 | B2 * | 12/2012 | Gwag .................... | F16M 11/10 248/922 |
| 8,672,277 | B2 * | 3/2014 | Hsu ........................ | F16M 11/38 248/371 |

(Continued)

*Primary Examiner* — Anthony M Haughton
*Assistant Examiner* — Hung Q Dang
(74) *Attorney, Agent, or Firm* — Leong C. Lei

(57) ABSTRACT

An electronic device holder includes an electronic device; an extendible frame connectable with the electronic device and including at least one fastener; a clamper including a base and a clamping part mounted on the base; and a support frame rotatably connected to the extendible frame and the clamper and including two supporting portions each including two connection rods parallel to and spaced from each other to define a slide channel. Upper and lower fixing rings are respectively arranged at upper and lower ends of the connection rods. An upper rotation axle is arranged between the two upper fixing rings and is rotatable in synchronization therewith. A lower rotation axle is arranged between the lower fixing rings and is rotatable in synchronization therewith. The fastener penetrates through and is movable along the slide channel to make the extendible frame reciprocally move to extend/contract relative to the support frame.

5 Claims, 7 Drawing Sheets

(56) References Cited

U.S. PATENT DOCUMENTS

| | | | | |
|---|---|---|---|---|
| 9,033,292 B2 * | 5/2015 | Lu | ............................ | F16M 11/12 |
| | | | | 248/51 |
| 10,845,000 B2 * | 11/2020 | Lau | ........................ | F16M 13/022 |
| 11,118,729 B2 * | 9/2021 | Zebarjad | ................ | F16M 13/022 |
| 12,072,060 B2 * | 8/2024 | Chen | ...................... | F16M 13/022 |

* cited by examiner

ELECTRONIC DEVICE HOLDER

TECHNICAL FIELD OF THE INVENTION

The present invention relates to a holder, and more particularly to an electronic device holder.

DESCRIPTION OF THE PRIOR ART

The present inventor has been previously developed a "display screen adjusting device", which has been assigned Taiwan Utility Model M608275. The device includes a connecting seat, a base, an upper rotation axle, a lower rotation axle, and two supporting members. The connecting seat is provided with a display screen. The base is spaced from the connecting seat by a distance. The upper rotation axle is rotatably mounted on the connecting seat. The lower rotary rotation is rotatably mounted to the base. The two supporting members are arranged parallel to and spaced from each other. Each of the supporting members is formed of two bars that are respectively fixed to an upper fixing ring and a lower fixing ring. The upper rotation axle is arranged between the two upper fixing rings. The lower rotation axle is arranged between the two lower fixing rings. When the two supporting members rotate about a center defined by the lower rotation axle, the two bars generate respectively relative movements of "one pushing" and "one pulling", so as to make the two upper fixing rings synchronously rotating. The upper rotation axle follows the two upper fixing rings to rotate to thereby drive the connecting seat to rotate, making the display screen on the connecting seat rotating.

However, in the course of long time researching and developing of the display screen adjusting devices, the present inventor found the display screen adjusting device is devoid of a function of extension/contraction, so that, in use, the user has to actively adjust the seat location and sitting posture to match with the display screen in order to have the most suitable angle and distance for viewing. Thus, in order to further improve the display screen adjusting device, the present inventor provides the invention as described herein.

SUMMARY OF THE INVENTION

To achieve the above objective, the present invention provides an electronic device holder, which comprises an electronic device; an extendible frame, which is connectable to the electronic device, the extendible frame comprising at least one fastener; a clamper, which is arranged at one side of the electronic device, the clamper comprising a base and a clamping part, the clamping part being mounted on the base; and a support frame, which is rotatably connected to each of the extendible frame and the clamper, the support frame comprising two supporting portions, each of the supporting portions comprising two connection rods, the two connection rods being arranged parallel to and spaced from each other to define a slide channel, upper and lower ends of the two connection rods being respectively provided with an upper fixing ring and a lower fixing ring, an upper rotation axle being arranged between the two upper fixing rings, the two upper fixing rings being rotatable in synchronization with the upper rotation axle, a lower rotation axle being arranged between the two lower fixing rings, the two lower fixing rings being rotatable in synchronization with the lower rotation axle, wherein the fastener of the extendible frame penetrates through the slide channel and is movable along the slide channel to cause the extendible frame to reciprocally move with the fastener and extending/contracting with respect to the support frame.

In the above device, an extension spring is arranged between the upper rotation axle and the lower rotation axle.

In the above device, a torsional spring is arranged between the upper rotation axle and the lower rotation axle.

In the above device, the fastener comprises a bolt and a nut.

In the above device, the electronic device is selected as one of a smart phone, a display screen, a tablet computer, and a display panel.

By having the fastener of the extendible frame penetrating through the slide channel and moving along the slide channel, the extendible frame is caused to reciprocally move with the fastener, so as to extend/contract with respect to the support frame, to thereby realize a function of extension/contraction of the support frame.

DETAILED DESCRIPTION OF THE PREFERRED EMBODIMENT

Figure 1:
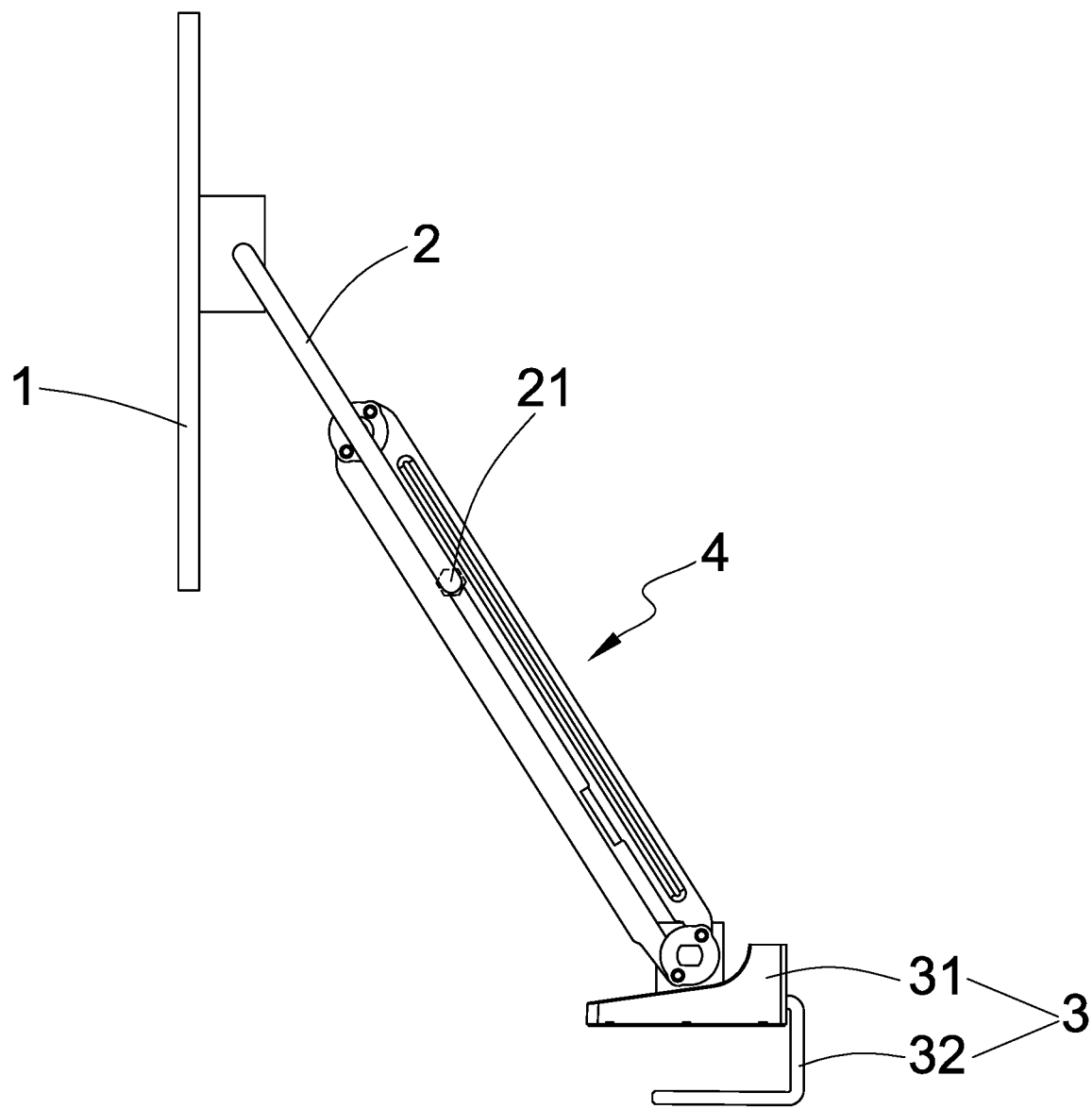
FIG. 1 is a schematic view showing an electronic device holder according to the present invention.
Figure 2:
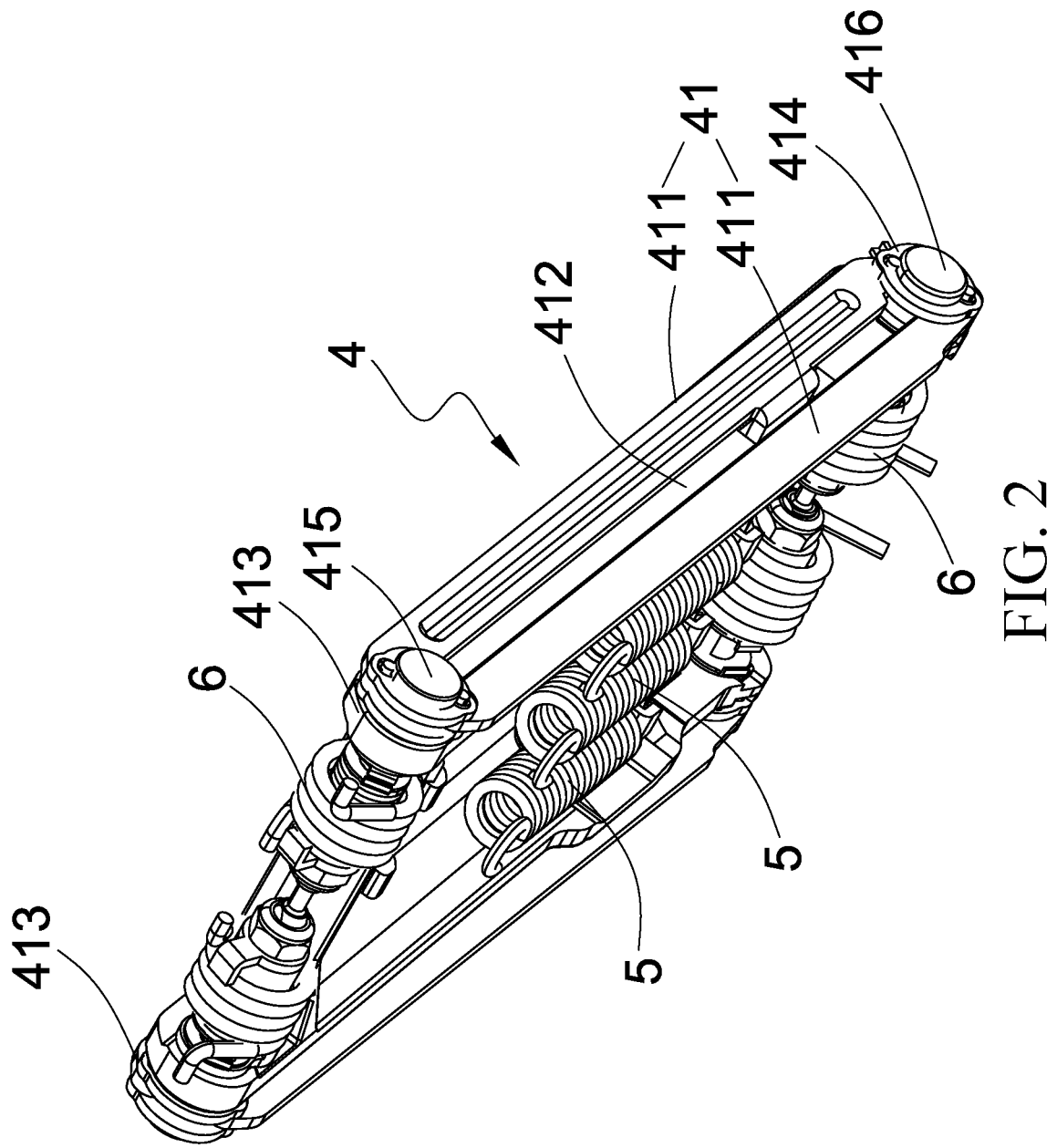
FIG. 2 is a schematic view showing a support frame according to the present invention.

Referring to FIGS. 1 and 2, the present invention provides an electronic device holder, which comprises: an electronic device 1, an extendible frame 2, a clamper 3, and a support frame 4.

The electronic device 1 can be selected as one of a smart phone, a display screen, a tablet computer, and a display panel, but is not limited thereto.

The extendible frame 2 is connectable to the electronic device 1. The extendible frame 2 is provided with at least one fastener 21. The fastener 21 may include a bolt 211 and a nut 212 (as shown in FIG. 2A).

Figure 3:
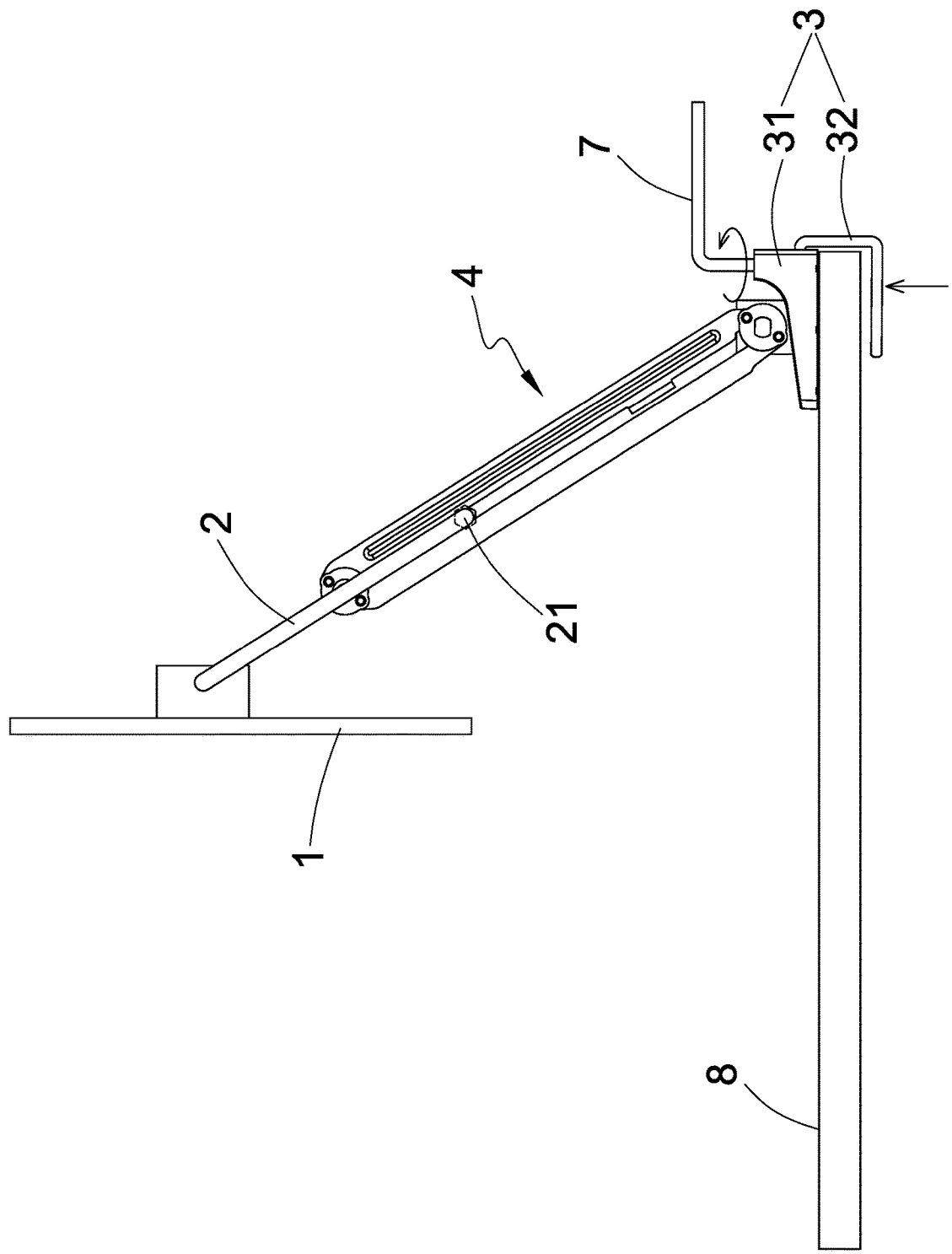
FIG. 3 is a schematic view illustrating adjusting of a clamper according to the present invention.
Figure 4:
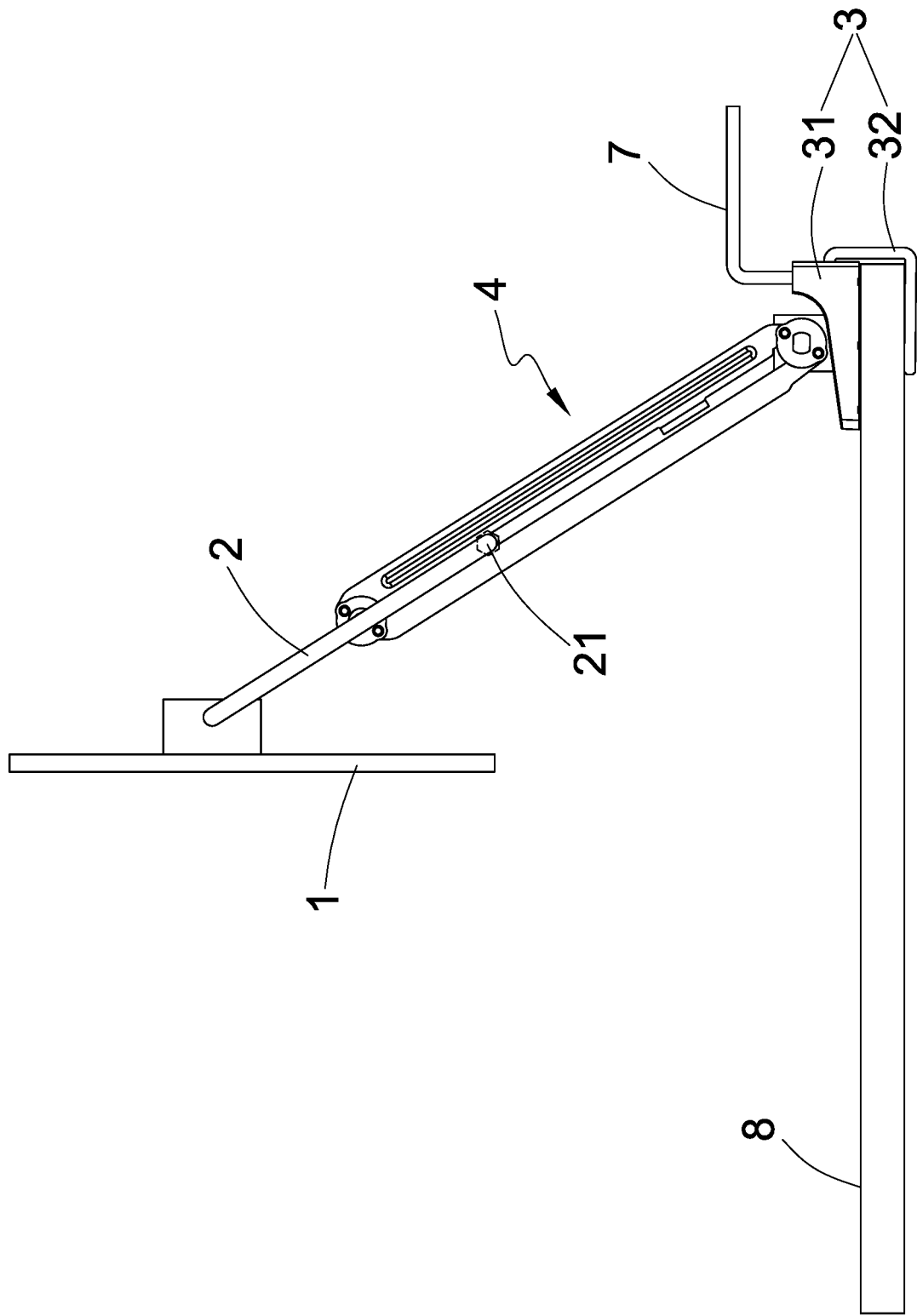
FIG. 4 is a schematic view illustrating the clamper according to the present invention clamping on a desk.

The clamper 3 is arranged at one side of the electronic device 1. The clamper 3 comprises a base 31 and a clamping part 32. The clamping part 32 is mounted on the base 31. Referring to FIGS. 3 and 4, the clamping part 32 is movable, upward and/or downward, relative to the base 31, so that a tool 7 may be applied to change a relative position between the clamping part 32 and the base 31 in order to clamp on a desk or table 8.

With continuous reference to FIGS. 1 and 2, the support frame 4 is rotatably connected to the extendible frame 2 and the clamper 3. The support frame 4 comprises two supporting portions 41, and each of the supporting portions 41 is provided with two connection rods 411. The two connection rods 411 are arranged parallel to and spaced from each other so as to form a slide channel 412. Upper and lower ends of the two connection rods 411 are respectively provided with an upper fixing ring 413 and a lower fixing ring 414. An upper rotation axle 415 is arranged between the two upper fixing rings 413, and the two upper fixing rings 413 and the upper rotation axle 415 are rotatable in synchronization with each other. A lower rotation axle 416 is arranged between the two lower fixing rings 414, and the two lower fixing rings 414 and the lower rotation axle 416 are rotatable in synchronization with each other. Referring to FIG. 2A, the fastener 21 of the extendible frames 2 is set through the slide channel 412 and is movable along the slide channel 412, so as to allow the extendible frame 2 to be reciprocally movable with the fastener 21 thereby extending/contracting with respect to the support frame 4 (as shown in FIG. 5).

Figure 2A:
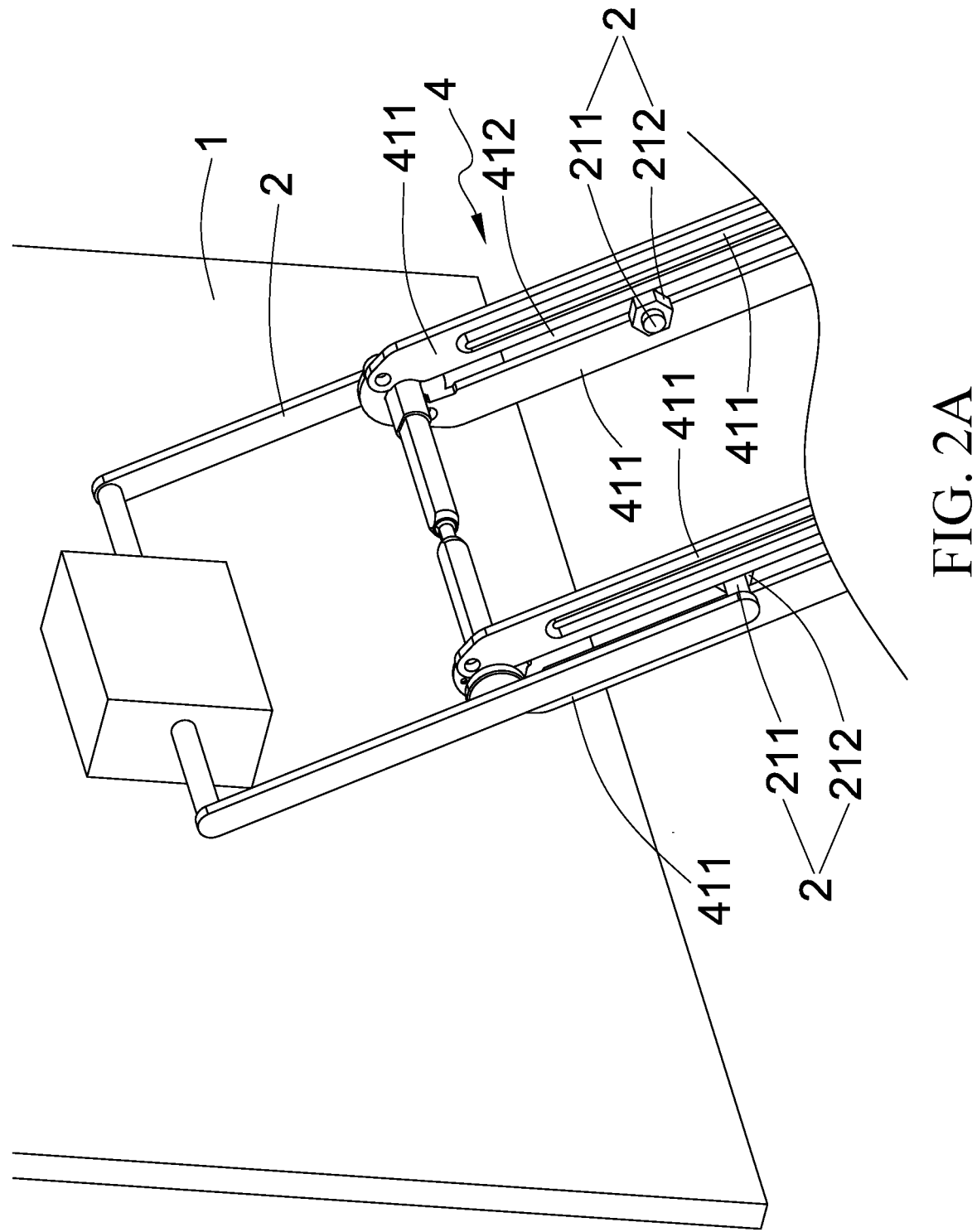
FIG. 2A is a schematic view showing an extendible frame and the support frame according to the present invention.
Figure 5:
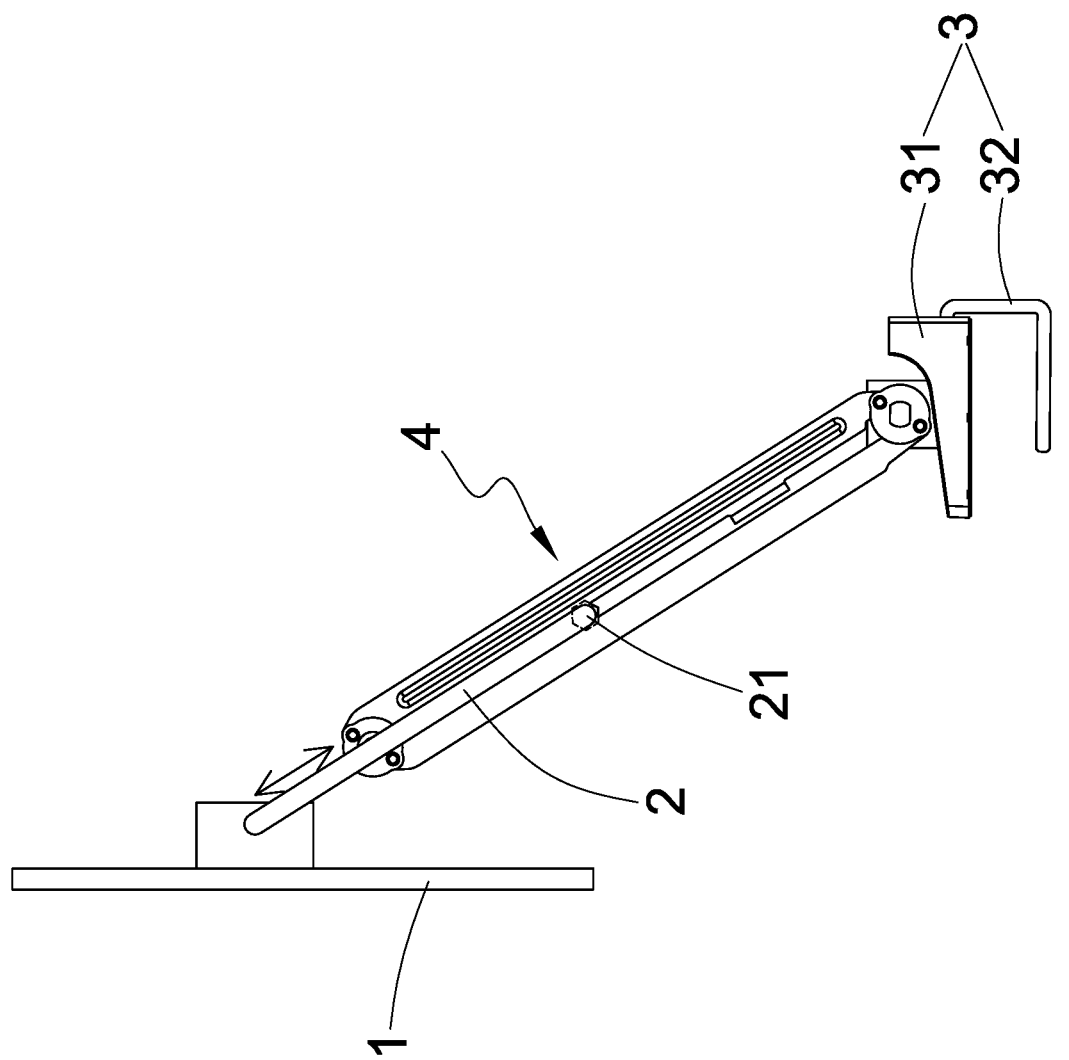
FIG. 5 is a schematic view illustrating extending of the extendible frame according to the present invention.
Figure 6:
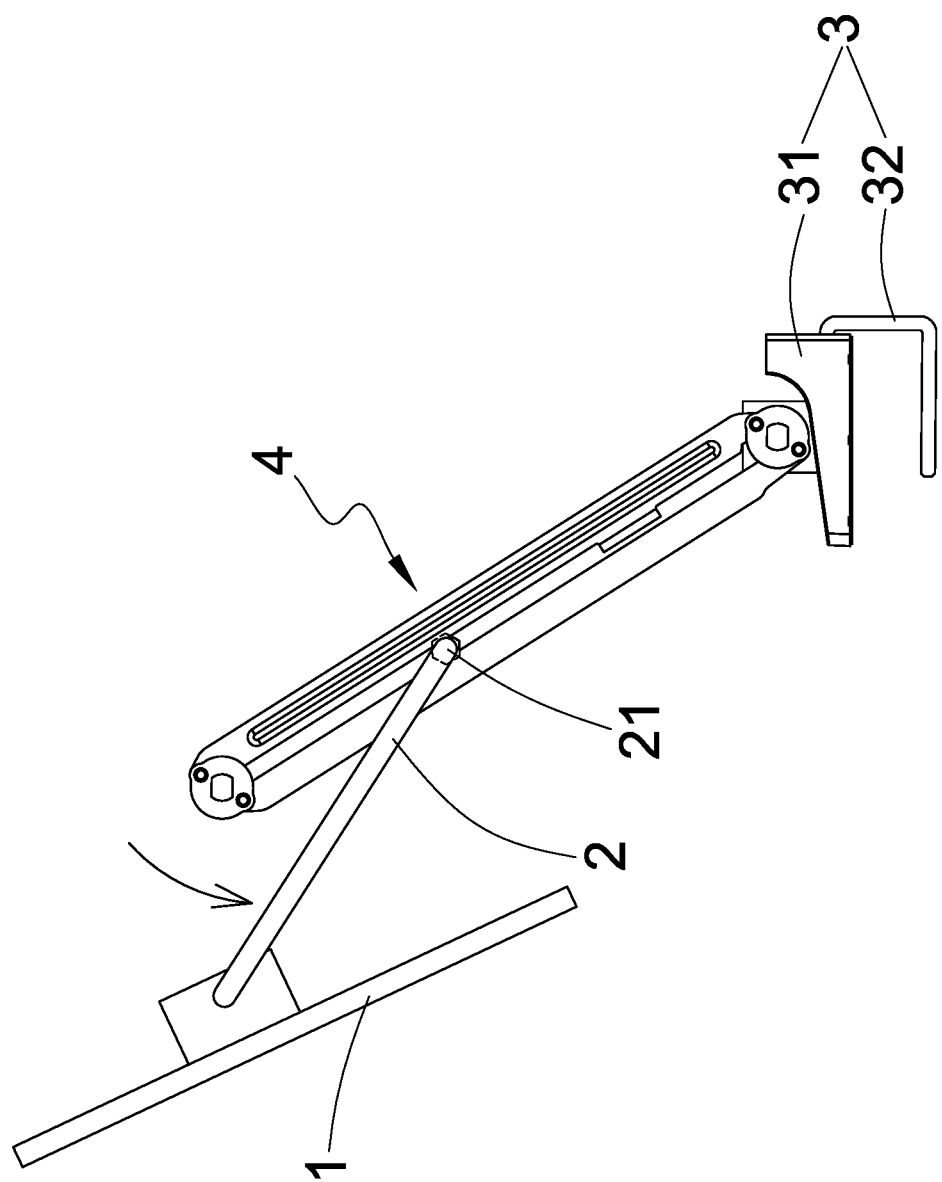
FIG. 6 is a schematic view illustrating the support frame rotating relative to the support frame according to the present invention.

Referring to FIGS. 2A and 5, specifically, the bolt 211 is arranged on the extendible frame 2, and the bolt 211 penetrates through the slide channel 412 of the support frame 4 to screw into the nut 212, so that the support frame 4 is connected, in a rotatable manner, to the extendible frame 2, and the extendible frame 2 is rotatable, about an axis or center defined by the fastener 21, relative to the support frame 4 (as shown in FIG. 6), and also, the bolt 211 is movable along the slide channel 412, so that the extendible frame 2 is reciprocally movable with the fastener 21 to extend/contract with respect to the support frame 4 (as shown in FIG. 5).

Further, referring to FIGS. 1 and 2, when the two connection rods 411 of each of the supporting portions 41 rotate about an axis or center defined by the lower rotation axle 416, the two lower fixing rings 414 and the lower rotation axle 416 are caused to rotate, in synchronization with each other, and the two lower fixing rings 414 drive the two connection rods 411, such that the two connection rods 411 respectively generate a pushing fashion relative movement and a pulling fashion relative movement to cause the upper fixing rings 413 to rotate, and the two upper fixing rings 413 and the upper rotation axle 415 are rotated synchronously.

In addition, referring to FIG. 2, a single or plural extension springs 5 are arranged between the upper rotation axle 415 and the lower rotation axle 416. The extension springs 5 provide a pulling force, such that the pulling force resists the gravitational force of the electronic device 1. Further, a single or plural torsional springs 6 are arranged between the upper rotation axle 415 and the lower rotation axle 416. The torsional springs 6 provide a torsional force, and the torsional force resists the gravitational force of the electronic device 1, so as to prevent the upper rotation axle 415 and the lower rotation axle 416 from being difficult to rotate due to the gravitational force of the electronic device 1.

In summary, the present invention provides the fastener 21 of the extendible frame 2 penetrating through the slide channel 412 and movable along the slide channel 412 to make the extendible frame 2 reciprocally movable relative to the fastener 21 and thus extending/contracting with respect to the support frame 4, so as to realize an extension/contraction function of the support frame.

I claim:

1. An electronic device holder, comprising:
an electronic device;
an extendible frame, which is connectable to the electronic device, the extendible frame comprising at least one fastener;
a clamper, which is arranged at one side of the electronic device, the clamper comprising a base and a clamping part, the clamping part being mounted on the base; and
a support frame, which is rotatably connected to each of the extendible frame and the clamper, the support frame comprising two supporting portions, each of the supporting portions comprising two connection rods, the two connection rods being arranged parallel to and spaced from each other to define a slide channel, upper and lower ends of the two connection rods being respectively provided with an upper fixing ring and a lower fixing ring, an upper rotation axle being arranged between the two upper fixing rings, the two upper fixing rings being rotatable in synchronization with the upper rotation axle, a lower rotation axle being arranged between the two lower fixing rings, the two lower fixing rings being rotatable in synchronization with the lower rotation axle, wherein the fastener of the extendible frame penetrates through the slide channel and is movable along the slide channel to cause the extendible frame to reciprocally move with the fastener and extending/contracting with respect to the support frame.

2. The electronic device holder according to claim 1, wherein an extension spring is arranged between the upper rotation axle and the lower rotation axle.

3. The electronic device holder according to claim 1, wherein a torsional spring is arranged between the upper rotation axle and the lower rotation axle.

4. The electronic device holder according to claim 1, wherein the fastener comprises a bolt and a nut.

5. The electronic device holder according to claim 1, wherein the electronic device is selected as one of a smart phone, a display screen, a tablet computer, and a display panel.

* * * * *